United States Patent
Park

(10) Patent No.: US 7,517,781 B2
(45) Date of Patent: Apr. 14, 2009

(54) METHOD OF MANUFACTURING SEMICONDUCTOR DEVICE

(75) Inventor: Jeong-Ho Park, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 133 days.

(21) Appl. No.: 11/637,056

(22) Filed: Dec. 12, 2006

(65) Prior Publication Data

US 2007/0132036 A1 Jun. 14, 2007

(30) Foreign Application Priority Data

Dec. 14, 2005 (KR) .................. 10-2005-0123282

(51) Int. Cl.
*H01L 21/00* (2006.01)

(52) U.S. Cl. .................. 438/592; 438/595; 438/300

(58) Field of Classification Search ............. 438/592, 438/595, 300
See application file for complete search history.

(56) References Cited

U.S. PATENT DOCUMENTS

| | | | |
|---|---|---|---|
| 6,319,807 B1* | 11/2001 | Yeh et al. | 438/595 |
| 6,440,808 B1* | 8/2002 | Boyd et al. | 438/305 |
| 6,645,818 B1* | 11/2003 | Sing et al. | 438/275 |
| 6,750,108 B2* | 6/2004 | Ueda | 438/303 |
| 7,094,650 B2* | 8/2006 | Chaudhary et al. | 438/283 |
| 2004/0175909 A1* | 9/2004 | Matsumoto | 438/592 |
| 2007/0132036 A1* | 6/2007 | Park | 257/382 |
| 2007/0190767 A1* | 8/2007 | Nakamura et al. | 438/592 |

* cited by examiner

*Primary Examiner*—Laura M Menz
(74) *Attorney, Agent, or Firm*—Finnegan, Henderson, Farabow, Garrett & Dunner, L.L.P.

(57) ABSTRACT

A method for manufacturing a semiconductor device, includes sequentially forming a first insulation film and a dummy gate electrode on a semiconductor substrate; forming a lightly doped junction region by using the dummy gate electrode as a mask, forming a first spacer on a side wall of the dummy gate electrode, and then forming a heavily doped junction region. The method further includes forming a second insulation film on the semiconductor substrate where the heavily doped junction region is formed, and removing the dummy gate electrode to form a cavity exposing a portion of the first insulation layer; forming a second spacer on a side wall of the cavity; sequentially forming a gate insulation film and a gate conductor on the second spacer, and then removing the second insulation film and a portion of the gate insulation film; and forming a salicide film on a top of the gate conductor and in the lightly doped junction region.

9 Claims, 3 Drawing Sheets

METHOD OF MANUFACTURING SEMICONDUCTOR DEVICE

RELATED APPLICATION

This application is based upon and claims the benefit of priority to Korean Application No. 10-2005-0123282, filed on Dec. 14, 2005, the entire contents of which are incorporated herein by reference.

TECHNICAL FIELD

The present invention relates to a manufacturing method of a semiconductor device.

BACKGROUND

As semiconductor devices are gradually becoming more highly-integrated, a short-channel transistor fabrication technology is required. However, a short-channel effect which reduces the effective channel length occurs due to the lateral diffusion of source/drain diffusion layer. In general, the short-channel effect reduces the amount of ion implantation in a lightly doped junction region, thus minimizing the effect thereof.

In addition, as the length of a gate electrode is shortened, a narrow line effect occurs. Since the narrow line effect disturbs the formation of salicide, the effect of disturbance is minimized in such a manner to change the type of metal layers in order to deposit a salicide film.

However, the reduction of the amount of ion implantation in a lightly doped junction region gives rise to problems such as deterioration caused by a hot carrier effect becomes more noticeable and the resistance of the lightly doped junction region is increased. Moreover, the formation of salicide is disturbed by the narrow line effect, thereby leading to an increase in the resistance of a gate electrode. This causes a transistor operating signal of a semiconductor device to be distorted, which lowers the reliability of the semiconductor device.

Besides, new equipment should be used in order to change the type of metal layers. This makes the productivity of semiconductor devices decreased owing to the introduction of high-cost production facilities.

BRIEF SUMMARY

Consistent with the present invention, there is provided a manufacturing method of a semiconductor device having a short-channel transistor suppressing a short-channel effect while maintaining an area of a gate electrode on which salicide is formed identical to that in a conventional method.

Consistent with an embodiment of the present invention, a salicide is formed by using a dual spacer.

Consistent with the present invention, there is provided a method for manufacturing a semiconductor device, including the steps of: sequentially forming a first insulation film and a dummy gate electrode on a semiconductor substrate; forming a lightly doped junction region by using the dummy gate electrode, forming a first spacer on a side wall of the dummy gate electrode, forming a heavily doped junction region; forming a second insulation film on the semiconductor substrate where the heavily doped junction region is formed, and removing the dummy gate electrode to form a cavity exposing a portion of the first insulating layer; forming a second spacer on a side wall of the cavity; sequentially forming a gate insulation film and a gate conductor on the second spacer and then removing the second insulation film and a portion of the gate insulation film; and forming a salicide film on a top of the gate conductor and in the lightly doped junction region.

BRIEF DESCRIPTION OF THE DRAWINGS

The above features consistent with the present invention will become apparent from the following description of preferred embodiments, given in conjunction with the accompanying drawings, in which.

DETAILED DESCRIPTION

Figure 1:
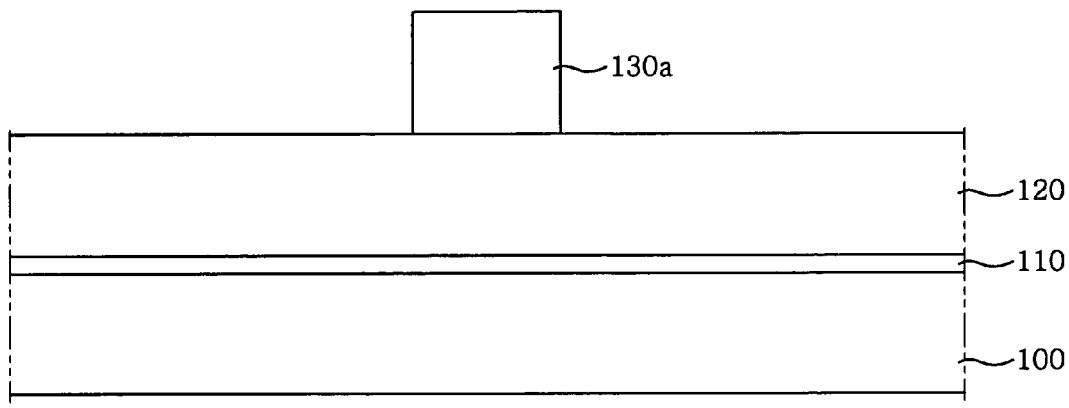
FIGS. 1 to 7 are cross-sectional views sequentially showing respective steps of a manufacturing method of a semiconductor device consistent with an embodiment of the present invention.

Hereinafter, an embodiment of the present invention will be described in detail with reference to the accompanying drawings so that the invention can readily be carried out by those skilled in the art to which the invention pertains. However, the present invention may be implemented in many different forms, and therefore, is not limited to the embodiment illustrated herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, no intervening elements are present.

FIGS. 1 to 7 are cross-sectional views sequentially showing respective steps of a manufacturing method of a semiconductor substrate in accordance with an embodiment consistent with the present invention.

As shown in FIG. 1, a first insulation film 110 and a dummy gate film 120 are sequentially deposited on a semiconductor substrate 100. Dummy gate film 120 is preferably formed of polysilicon. A photosensitive material is coated on dummy gate film 120 to deposit a photosensitive film (not shown). Thereafter, the photosensitive film is exposed to light and developed to form a photosensitive film pattern 130a exposing a part of dummy gate film 120.

Figure 2:
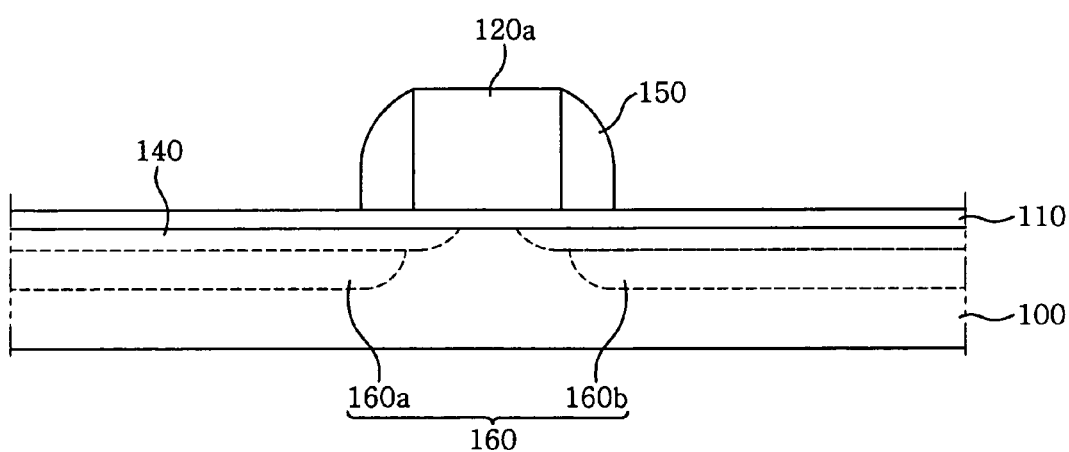

Next, as shown in FIG. 2, dummy gate film 120 is etched by using photosensitive film pattern 130a as an etching mask, thereby forming a dummy gate electrode 120a. Then, photosensitive film pattern 130a is removed.

Subsequently, by using dummy gate electrode 120a as a mask, n-type or p-type impurity ions are implanted on semiconductor substrate 100 at a low concentration to form a lightly doped junction region 140 at both sides of dummy gate electrode 120a. A heat treatment process is then carried out so that lightly doped junction region 140 can be diffused in a direction parallel to the surface of first insulation film 110 from below dummy gate electrode 120a outwards in both directions.

In succession, a first nitride film (not shown) is formed on semiconductor substrate 100 and dummy gate electrode 120a. Afterwards, the first nitride film is etched by an overall etching method to form a first spacer 150 on the side walls of dummy gate electrode 120a.

Subsequently, by using dummy gate electrode 120a and first spacer 150 as a mask, n-type or p-type impurity ions are implanted at a high concentration to form a source 160a and a drain 160b which belong to a heavily doped junction region 160. Then, a heat treatment process is conducted so that heavily doped junction region 160 can be diffused horizontally from below first spacer 150 outwards in both directions.

Figure 3:
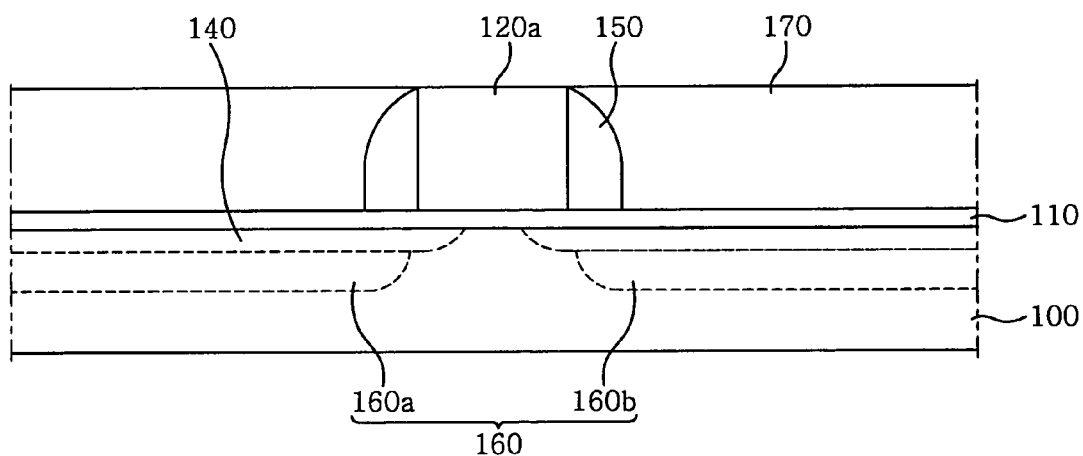

Thereafter, as depicted in FIG. 3, a second insulation film 170 is formed on semiconductor substrate 100, dummy gate electrode 120a, and first spacer 150. Second insulation film 170 is preferably formed of any one of TEOS (tetra ethyl ortho silicate), MTO (medium temperature oxide), USG (undoped silicate glass), and $SiH_4$-rich oxide. Then, second insulation film 170 is planarized by a CMP (chemical mechanical polishing) process until dummy gate electrode 120a is exposed.

Figure 4:
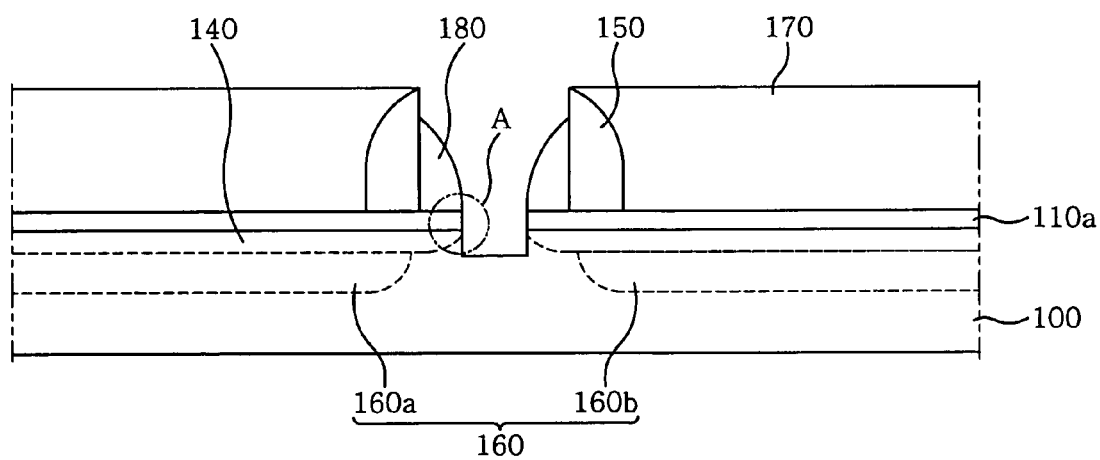

Next, as shown in FIG. 4, dummy gate electrode 120a is removed by using a mixed solution of $HF:HNO_3:H_2O$ as an etching solution. Then, a second nitride film (not shown) is deposited on second insulation film 170 and in the cavity from which the dummy gate electrode 120a is removed. Subsequently, with an overall etching method, the second nitride film forms a second spacer 180 on a side wall of the cavity from which dummy gate electrode 120a was removed.

The exposed first insulation film 110 and semiconductor substrate 100 under the film are further etched, thereby forming a first insulation film pattern 110a. The substrate 100 is etched to a depth of approximately 50 to 200 Å. Through this etching process, part "A" of the lightly doped junction region is etched, and thus, the short-channel effect can be suppressed.

Figure 5:
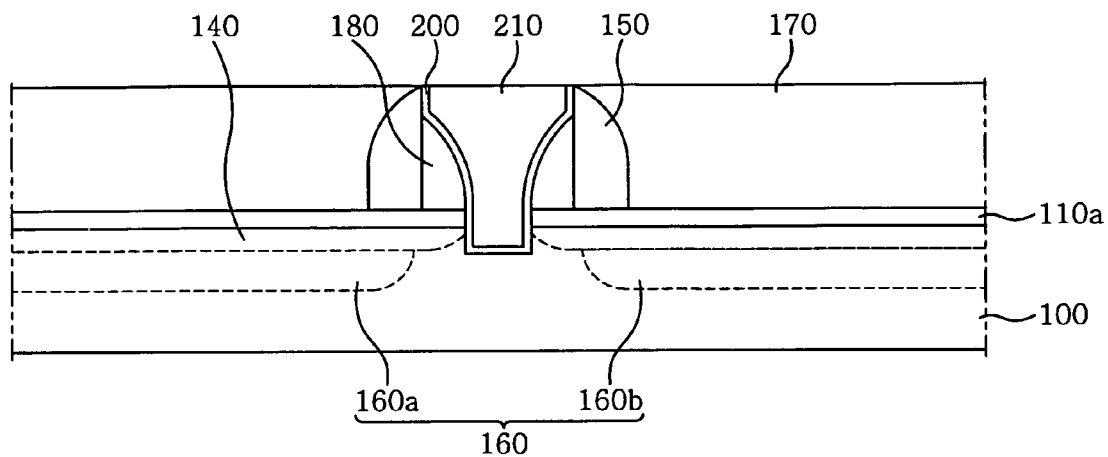

After that, as shown in FIG. 5, a gate insulation film 200 and a gate conductor 210 are sequentially deposited on second insulation film 170, second spacer 180, and the exposed semiconductor substrate 100. Gate conductor 210 may be formed of polysilicon.

Next, gate insulation film 200 and gate conductor 210 are planarized by a CMP process until second insulation film 170 is exposed as shown in FIG. 5.

Figure 6:
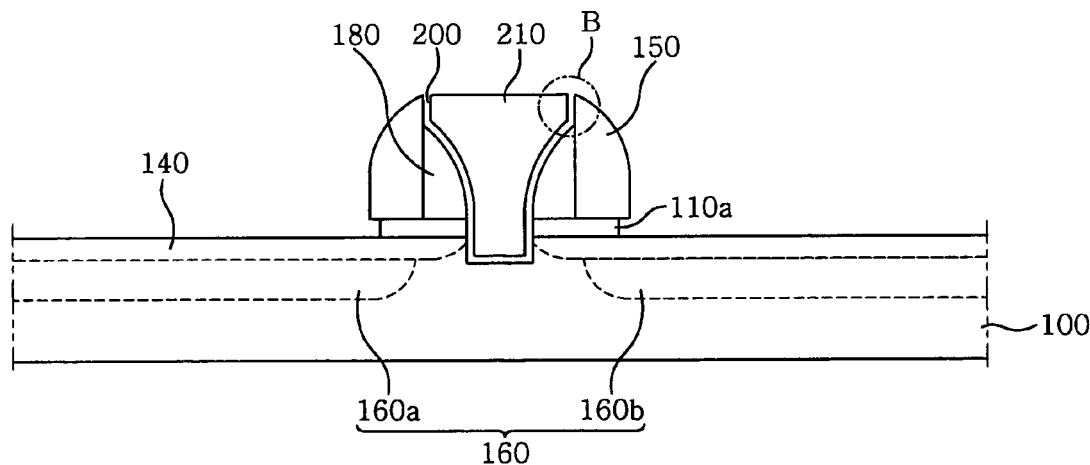

Then, as shown in FIG. 6, second insulation film 170 is removed by using a mixed solution of $HF(49\%):H_2O$ or $NH_4F:HF$ as an etching solution. At this point, a portion of first insulation film pattern 110a covered by first spacer 150 is also etched. In addition, a part "B" of gate insulation film 200 is etched too.

Figure 7:
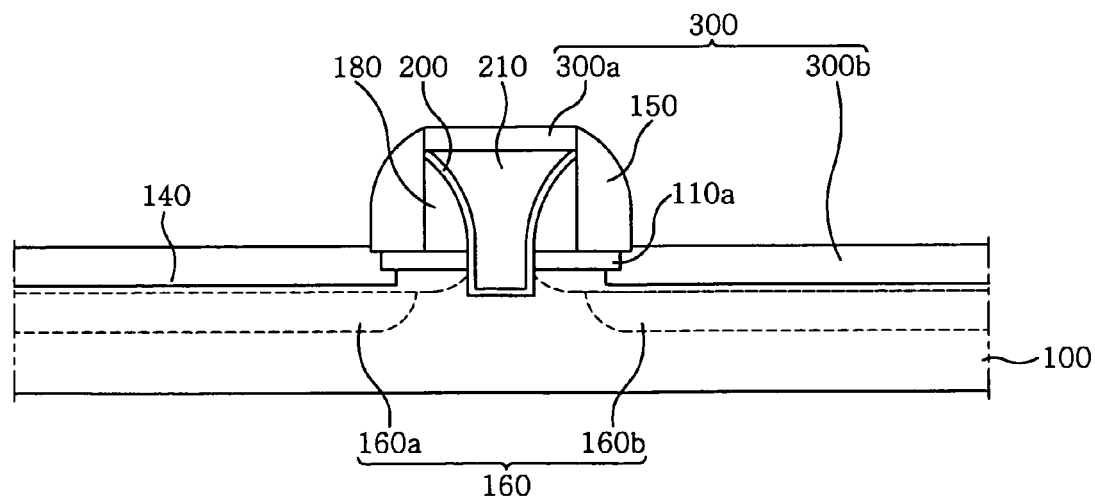

Subsequently, as shown in FIG. 7, a salicide film 300 is formed by using a damascene process on a top portion of gate conductor 210, on removed part "B" of gate insulation film 200, and on lightly doped junction region 140. Salicide film 300 is preferably formed of any one of Co, Ti, and Ni.

Due to removal of part "B" of gate insulation film 200, a salicide film 300a having the same area as dummy gate electrode 120a can be formed on the top portion of gate conductor 210.

A salicide film 300b formed in lightly doped junction region 140 can be formed wider according to the type of metal used as it diffuses to the lower portion of semiconductor substrate 100.

As set forth above, the manufacturing method of a semiconductor device consistent with the present invention can manufacture a short-channel transistor using dual spacers in which spacers are formed on inner and outer side walls of a dummy gate electrode, respectively.

Furthermore, the short-channel effect can be suppressed by etching a part of a lightly doped junction region.

Moreover, salicide can be formed, without introduction of additional equipment, by keeping an area of a gate electrode, on which the salicide is formed, the same.

While the invention has been shown and described with respect to the preferred embodiments, it will be understood by those skilled in the art that various changes and modification may be made without departing from the spirit and scope of the invention as defined in the following claims.

What is claimed is:

1. A method for manufacturing a semiconductor device, comprising the steps of:
    sequentially forming a first insulation film and a dummy gate electrode on a semiconductor substrate:
    forming a lightly doped junction region by using the dummy gate electrode as a mask;
    forming a first spacer on a side wall of the dummy gate electrode;
    forming a heavily doped junction region;
    forming a second insulation film on the semiconductor substrate where the heavily doped junction region is formed, and removing the dummy gate electrode to form a cavity exposing at least a portion of the first insulation layer;
    forming a second spacer on a side wall of the cavity by etching the exposed portion of the first insulation film and at least a portion of the semiconductor substrate beneath the exposed portion of the first insulation film;
    sequentially forming a gate insulation film and a gate conductor on the second spacer, and then removing the second insulation film and at least a portion of the gate insulation film; and
    forming a salicide film on a top of the gate conductor and in the lightly doped junction region.

2. The method of claim 1, wherein the portion of the semiconductor substrate below the exposed portion of the first insulation film is etched to a depth of about 50 to 200 Å.

3. The method of claim 1, wherein the salicide film is formed of any one selected from a group including Co, Ti, and Ni.

4. The method of claim 1, wherein forming the salicide film further comprises forming the salicide film on the gate insulation film to at least partly fill in the removed portion of the gate insulation film.

5. The method of claim 1, wherein the first spacer and the second spacer are formed of a nitride film.

6. The method of claim 1, wherein the second insulation film is formed of TEOS (tetra ethyl ortho silicate), MTO (medium temperature oxide), USG (undoped silicate glass), or $SiH_4$-rich oxide.

7. The method of claim 1, wherein the dummy gate electrode is removed by an etching solution containing $HF:HNO_3:H_2O$.

8. The method of claim 1, wherein the second insulation film is removed by an etching solution containing $HF(49\%):H_2O$ or $NH_4F:HF$.

9. The method of claim 1, wherein the second insulation film is planarized by using CMP (chemical mechanical polishing) process until a portion of the dummy gate electrode is exposed.

* * * * *